(12) United States Patent
Hwang et al.

(10) Patent No.: US 12,156,420 B2
(45) Date of Patent: Nov. 26, 2024

(54) DISPLAY DEVICE AND METHOD OF MANUFACTURING THE SAME

(71) Applicant: Samsung Display Co., Ltd., Yongin-si (KR)

(72) Inventors: Seongjin Hwang, Suwon-si (KR); Kyu Young Kim, Suwon-si (KR); Dohoon Kim, Asan-si (KR); Sanghoon Kim, Hwaseong-si (KR); Sang-Il Park, Yongin-si (KR); Min-Hoon Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 652 days.

(21) Appl. No.: 17/282,920

(22) PCT Filed: Oct. 12, 2019

(86) PCT No.: PCT/KR2019/013695
§ 371 (c)(1),
(2) Date: Apr. 5, 2021

(87) PCT Pub. No.: WO2020/096219
PCT Pub. Date: May 14, 2020

(65) Prior Publication Data
US 2021/0399257 A1 Dec. 23, 2021

(30) Foreign Application Priority Data
Nov. 5, 2018 (KR) .......... 10-2018-0134601

(51) Int. Cl.
*B32B 27/02* (2006.01)
*H10K 50/80* (2023.01)
(Continued)

(52) U.S. Cl.
CPC ....... *H10K 50/8426* (2023.02); *H10K 50/865* (2023.02); *H10K 50/868* (2023.02); *H10K 59/40* (2023.02); *H10K 71/00* (2023.02)

(58) Field of Classification Search
CPC .... G06F 1/1616; G06F 1/1652; G06F 3/0443; H10K 2102/311; H10K 50/8426;
(Continued)

(56) References Cited

U.S. PATENT DOCUMENTS 8,263,211 B2 9/2012 Nishimura
9,296,638 B2 3/2016 Lezzi et al.
(Continued)

FOREIGN PATENT DOCUMENTS

KR 2010-12601 1/2010
KR 10-2010-0027109 3/2010
(Continued)

OTHER PUBLICATIONS

Extended European Search Report for European Application No. or Patent No. 19882348.6, dated Jul. 19, 2022.
(Continued)

*Primary Examiner* — Lawrence D Ferguson
(74) *Attorney, Agent, or Firm* — KILE PARK REED & HOUTTEMAN PLLC

(57) ABSTRACT

A display device includes a window, a display panel disposed below the window, and an adhesive layer disposed between the window and the display panel. The window includes a glass portion, and a synthetic resin portion overlapping at least a side surface of the glass portion and exposing the upper surface of the glass portion.

19 Claims, 14 Drawing Sheets

(51) Int. Cl.
*H10K 50/842* (2023.01)
*H10K 50/86* (2023.01)
*H10K 59/40* (2023.01)
*H10K 71/00* (2023.01)

(58) Field of Classification Search
CPC ............ H10K 50/844; H10K 50/8445; H10K 50/865; H10K 50/868; H10K 59/40; H10K 59/87; H10K 71/00; H10K 77/111
See application file for complete search history.

(56) References Cited

U.S. PATENT DOCUMENTS

| | | | |
|---|---|---|---|
| 10,586,941 B2 | 3/2020 | Lee et al. | |
| 10,599,321 B2 | 3/2020 | Kwon et al. | |
| 2010/0159183 A1* | 6/2010 | Nishimura | G06F 3/044 156/182 |
| 2011/0210937 A1 | 9/2011 | Kee et al. | |
| 2012/0055826 A1 | 3/2012 | Nishimura | |
| 2015/0266272 A1 | 9/2015 | Lee et al. | |
| 2017/0036941 A1 | 2/2017 | Lee et al. | |
| 2017/0047351 A1 | 2/2017 | Kwon et al. | |
| 2018/0308903 A1 | 10/2018 | Jeong et al. | |
| 2018/0371196 A1 | 12/2018 | Park et al. | |

FOREIGN PATENT DOCUMENTS

| | | |
|---|---|---|
| KR | 10-1323600 | 11/2013 |
| KR | 10-2013-0139664 | 12/2013 |
| KR | 10-2014-0141165 | 12/2014 |
| KR | 10-1484452 | 2/2015 |
| KR | 10-2015-0051459 | 5/2015 |
| KR | 10-2015-0108991 | 10/2015 |
| KR | 10-1643377 | 7/2016 |
| KR | 10-2017-0020671 | 2/2017 |
| KR | 10-2017-0068823 | 6/2017 |
| KR | 10-2017-0084402 | 7/2017 |
| KR | 10-2017-0100103 | 9/2017 |
| KR | 10-2017-0122932 | 11/2017 |
| KR | 10-2018-0033583 | 4/2018 |
| WO | 2017/019840 | 2/2017 |

OTHER PUBLICATIONS

Juejun Hu et al., "Flexible integrated photonics: where materials, mechanics and optics meet [Invited]", Optical Materials Express, Sep. 1, 2013, pp. 1313-1331, vol. 3, No. 9.

Arun K. Varshneya, "Chemical Strengthening of Glass: Lessons Learned and Yet to Be Learned", International Journal of Applied Glass Science, 2010, pp. 131-142, vol. 1, No. 2, www.ceramics.org/IJAGS.

Hoikwan Lee et al., "Glass Thickness and Fragmentation Behavior in Stressed Glasses", New Journal of Glass and Ceramics, Oct. 2012, pp. 138-143, vol. 2, http://www.SciRP.org/journal/njgc.

International Search Report, with English translation, corresponding to International Application No. PCT/KR2019/013695 dated Jan. 29, 2020.

Written Opinion, with English translation, corresponding to International Application No. PCT/KR2019/013695, dated Jan. 29, 2020.

* cited by examiner

DISPLAY DEVICE AND METHOD OF MANUFACTURING THE SAME

CROSS-REFERENCE TO RELATED APPLICATION(S)

This application is a national entry of International Application No. PCT/KR2019/013695, filed on Oct. 12, 2019, which claims under 35 U.S.C. § 119(a) and 365 (b) priority to and benefits of Korean Patent Application No. 10-2018-0134601, filed on Nov. 5, 2018 in the Korean Intellectual Property Office, the entire contents of which are incorporated herein by reference.

BACKGROUND

1. Technical Field

The disclosure relates to a display device and a method of manufacturing the same, and, to a display device with a reduced defect rate and a method of manufacturing the same.

The disclosure provides a display device with high breaking strength and reduced assembly error of a housing.

The disclosure also provides a method of manufacturing a display device, the method capable of compensating for error in combining the constituent members of the disclosure.

Various types of display devices have been developed. Among them, a foldable display device that may replace existing display devices because the foldable display device is highly portable.

2. Description of the Related Art

Various display devices have been developed to be used for multimedia devices such as televisions, mobile phones, tablet computers, navigation units, and game machines. The display devices may include different components according to applications.

In manufacturing a display device, defects may occur in the assembly process of components.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device that may include a window having a glass portion; and a synthetic resin portion overlapping at least a side surface of the glass portion and exposing an upper surface of the glass portion; a display panel disposed below the window; and an adhesive layer disposed between the window and the display panel.

The synthetic resin portion may cover at least a portion of a lower surface of the glass portion.

The synthetic resin portion may completely overlap a lower surface of the glass portion.

The synthetic resin portion may include a first region having a first thickness; and a second region having a second thickness less than the first thickness of the first region, the first region may not overlap a lower surface of the glass portion in a plan view, and the second region may overlap the lower surface of the glass portion in a plan view.

The upper surface of the glass portion and an upper surface of the synthetic resin portion may be continuous or may form a step.

The window may include a light-blocking pattern disposed below the synthetic resin portion; and the light-blocking pattern may overlap at least the synthetic resin portion in a plan view.

The window may further include a synthetic resin film disposed below the glass portion and the synthetic resin portion; and a window adhesive layer that attaches the synthetic resin film to the glass portion and the synthetic resin portion. The light-blocking pattern may be directly disposed on a lower surface of the synthetic resin film.

A thickness of the glass portion may be about 100 µm or less.

The glass portion may include a tensile stress region; and a compressive stress region disposed outside of the tensile stress region, the compressive stress region forming an upper surface of the glass portion.

The display device may be foldable.

A side surface of the display panel and a side surface of the adhesive layer may be aligned with a side surface of the synthetic resin portion.

The display device may further include an input sensor disposed below the window; and a polarizer disposed below the window.

The synthetic resin portion may completely overlap the side surface of the glass portion.

A display device may include a window including a first portion including an inorganic material; and a second portion overlapping at least a side surface of the first portion, and exposing an upper surface of the first portion, the second portion including an organic material; a display panel disposed below the window; and an adhesive layer disposed between the window and the display panel.

A breaking strength of the first portion of the window may be in a range of about 0.8 Gpa to about 5 Gpa, and a yield strain of the second portion of the window may be in a range of about 1% to about 5%.

The first portion may include a chemically strengthened glass, and the second portion may include a synthetic resin.

A method for manufacturing a display device may include providing an adhesive member, a functional member, and a window wherein the window may include a glass portion, and a synthetic resin portion overlapping at least a side surface of the glass portion and exposing the upper surface of the glass portion; disposing the adhesive member between a lower surface of the synthetic resin portion and the functional member and combining the window with the functional member; setting a cutting line inside of the synthetic resin portion; and cutting the window, the adhesive member, and the functional member along the cutting line of the synthetic resin portion.

The functional member may include at least one of a display panel, a polarizer, and an input sensor.

The cutting of the window may include cutting by a laser.

A side surface of the synthetic resin portion may be aligned with a side surface of the adhesive member.

According to the above, the assembly error of a housing may be reduced. Assembly error may be reduced because it is possible to manufacture a display device corresponding to an area designed to cut a preliminary display device along a cutting line set in a synthetic resin portion. It is possible to provide a display device which may be accurately coupled or connected to the housing. Because a glass portion is not cut during the cutting process, the breaking strength of the window may be maintained.

In a foldable display device, a thin window is applied to the display device to reduce bending stress. Chemically strengthened glass is applied to the glass portion to increase the breaking strength of the thin window. The chemically strengthened glass has a property in which the breaking strength thereof rapidly decreases as the glass is cut by a laser beam, and according to the above, it is possible to maintain the breaking strength of the window because the synthetic resin portion is cut.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1A:
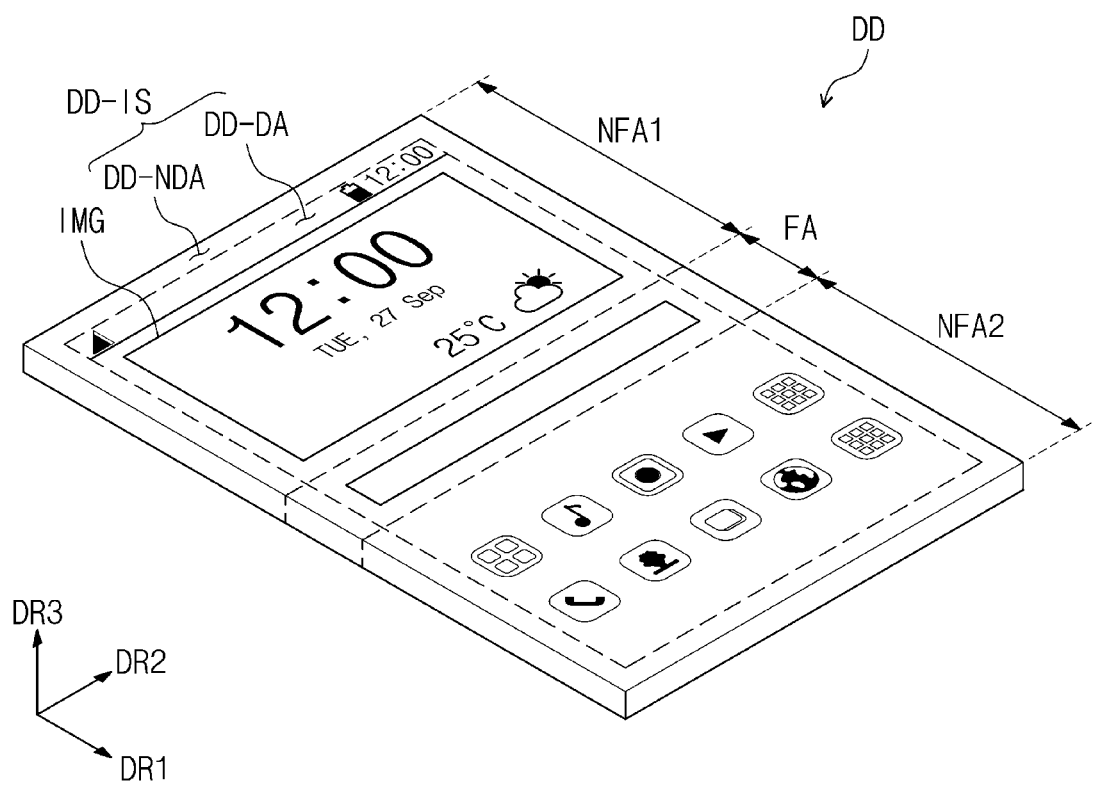
FIGS. 1A to 1C are perspective views of a display device according to an embodiment.

Hereinafter, embodiments will be described with reference to the accompanying drawings. In this specification, it will be understood that when an element (or a region, layer, portion, or the like) is referred to as being "on", "connected to", or "coupled to" another element, it can be directly on or directly connected or coupled to the other element, or a third element may be present therebetween.

It will be understood that the terms "connected to" or "coupled to" may include a physical or electrical connection or coupling.

Like reference numerals refer to like elements throughout. In addition, the thicknesses, ratios, and dimensions of elements in the drawings are exaggerated for effective description of the technical contents. As used herein, the term "and/or" includes any and all combinations of one or more of the associated listed items.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" and of may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A B, or A and B."

The terms "first", "second" and the like may be used for describing various elements, but the elements should not be construed as being limited by the terms. Such terms are only used for distinguishing one element from other elements. For example, a first element could be termed a second element and vice versa without departing from the teachings of the disclosure. The terms of a singular form may include plural forms unless otherwise specified.

Furthermore, the terms "under", "lower side", "on", "upper side", and the like are used to describe association relationships among elements illustrated in the drawings. The terms, which are relative concepts, are described on the basis of directions illustrated in the drawings but are not limited thereto.

For example, the spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations a the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly, oppose a second element. In a case in which a third element intervenes between the first and second element, the first and second element may be understood as being indirectly opposed to one another, although still facing each other.

It will be further understood that the terms "comprise", "comprising", "include", "including", "has", "having", and variations thereof and the like, when used in this specification, specify the presence of stated features, numbers, steps, operations, elements, components, or combinations thereof but do not preclude the presence or addition of one or more other features, numbers, steps, operations, elements, components, or combinations thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
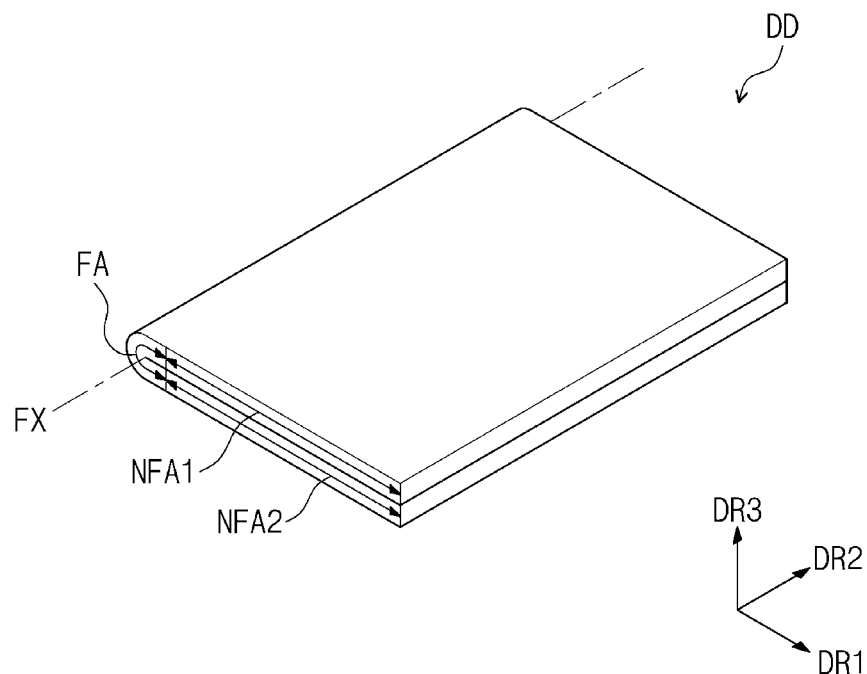
Figure 1C:
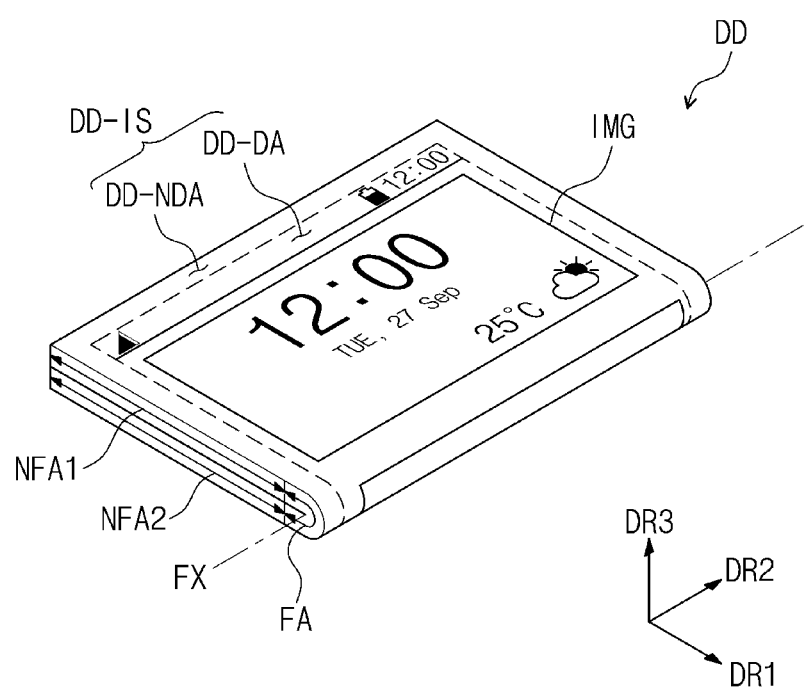

FIGS. 1A to 1C are perspective views of a display device according to an embodiment. As illustrated in FIG. 1A, the display device DD may display an image IMG through a display surface DD-IS. The display surface IDD-IS may be parallel to a surface defined by a first direction axis DR1 and a second direction axis DR2. A normal direction of the display surface DD-IS, for example, the thickness direction of the display device DD is indicated by a third direction axis DR3.

The front surface (or upper surface) and rear surface (or lower surface) of each member or units described below may be divided by the third direction axis DRU. However, the first to third direction axes DR1 DR2, and DR3 illustrated in an embodiment are merely examples. Hereinafter, the first to third directions are defined as directions indicated by the first to third direction axes DR1, DR2, and DR3, respectively, and refer to like reference numerals.

As illustrated in FIG. 1A, the display surface DD-IS may include an image region DD-DA in which the image or images IMG is/are displayed and a bezel region DD-NDA adjacent to the image region DD-DA. The bezel region DD-NDA may be a region in which an image is not displayed. FIG. 1A illustrates icon images as examples of the image IMG.

As illustrated in FIG. 1A, the image region DD-DA may have a substantially quadrangular shape. The bezel region DD-NDA may surround or may be adjacent to the image region DD-DA. However, the shapes of the image region DD-DA and the bezel region DD-NDA are not limited thereto, and may be relatively designed.

As illustrated in FIGS. 1A to 1C, the display device DD may include a plurality of regions defined according to operation types. The display device DD may include a first region NFA1, a second region NFA2, and a third region FA disposed between the first region NFA1 and the second region NFA2. The third region FA may be a region that is folded on the basis of the folding axis FX and substantially forms a curvature. Hereinafter, the first region NFA1, the second region NFA2, and the third region FA may be referred to as a first non-folding region NFA1, a second non-folding region NFA2, and a folding region FA.

As illustrated in FIG. 1B, the display device DD may be inner-folded so that the display surface DD-IS of the first non-folding region NFA1 faces the display surface DD-IS of the second non-folding region NFA2. As illustrated in FIG. 1C, a display module DM may be outer-folded so that the display surface DD-IS is exposed to the outside.

An embodiment, the display device DD may include a plurality of folding regions FA. The folding region FA may correspond to a manner in which a user operates the display device DD. For example, unlike the FIGS. 1B and 1C, the folding region FA may be defined in parallel with the first direction axis DR1 or may be defined in a diagonal direction. The area of the folding region FA is not fixed, and may be determined according to a radius of curvature. In an embodiment, the display device DD may be configured or structured so that only the operation modes illustrated in FIGS. 1A and 1B are repeated or only the operation modes illustrated in FIGS. 1A and 1C are repeated. Although a foldable display device DD is illustrated as an example, the disclosure is not limited thereto, and may also be applied to a rigid display device.

In an embodiment, a display device DD that may be applied to a mobile phone terminal is illustrated as an example. Although not illustrated, electronic modules mounted on a main board, a camera module, a power module, and the like may be combined with and disposed in a housing (not illustrated) together with the display device DD to form a mobile phone terminal. The housing may include a bracket. The housing may have any type of frame supporting the display device DR and may also include a support including a hinge structure. The display device DD according to the disclosure may be applied to not only a large-sized electronic device such as a television, and a monitor, but also a small- or medium-sized electronic device such as a tablet, a car navigation system, a game machine, and a smart watch, by way of non-limiting examples.

FIGS. 2A to 2D are schematic cross-sectional views of a display device DD according to an embodiment. FIGS. 2A to 2D illustrate cross sections defined by the second direction axis DR2 and the third direction axis DR3. FIGS. 2A to 2D explain a stacking relationship of a functional panel and/or functional units constituting the display device DD.

The display device DD according to an embodiment may include a protection unit, a display panel, an input sensor, an anti-reflection unit, and a window. Some or a number of configurations among the protection unit, the display panel, the input sensor, and the anti-reflection unit may be formed by a continuous process, or other configurations may be combined with each other by an adhesive member. In FIGS. 2A to 2D, an optically clear adhesive member OCA is illustrated as an adhesive member. The adhesive member described below may include an adhesive. In an embodiment, the protection unit, the anti-reflection unit, and the input sensor may be replaced with other components or omitted.

In FIGS. 2A to 2D, a corresponding configuration, formed through a continuous process together with other configurations, among the protection unit, the input sensor, and the anti-reflection unit, may be expressed as a "layer". A configuration combined by an adhesive member with other configurations among the protection unit, the input sensor, and the anti-reflection unit may be expressed as a "panel". The panel may include a base layer providing a base surface, such as a synthetic resin film, a composite material film, and a glass substrate, but the base layer may be omitted from the "layer". In other words, the units expressed as a "layer" may be disposed on a base surface provided by another unit or other units.

Depending on the presence or absence of a base layer, the protection unit, the input sensor, and the anti-reflection unit may be referred to as a protection panel, an input sensing panel, and a reflection prevention panel, or a protection layer, an input sensing layer, and a reflection prevention layer.

Figure 2A:
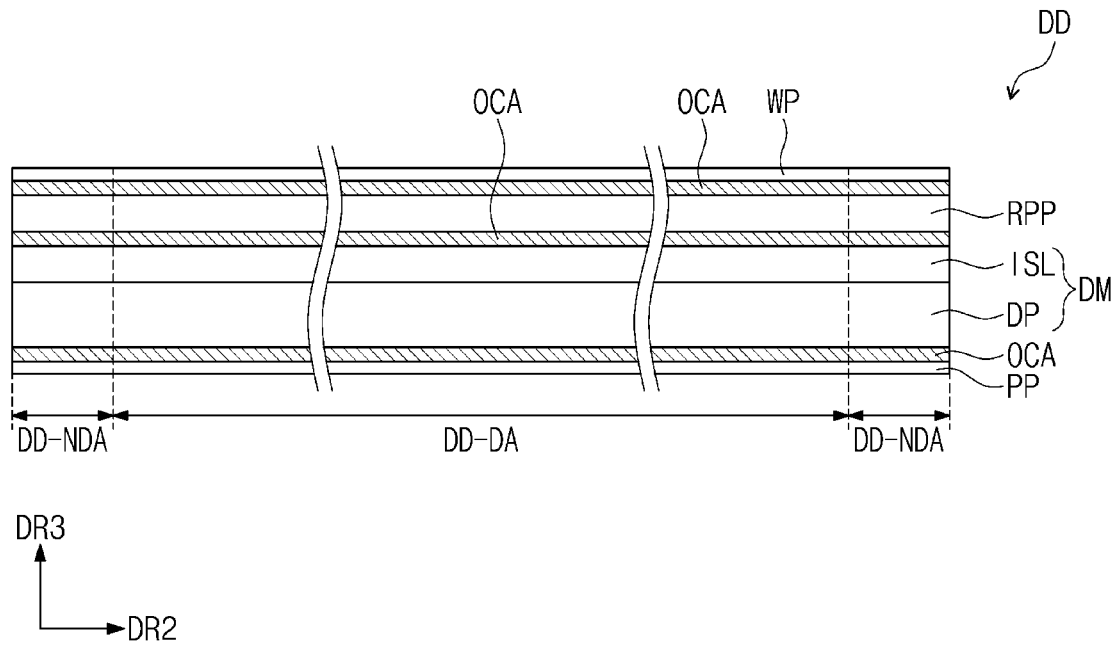
FIGS. 2A to 2D are schematic cross-sectional views of a display device according to an embodiment.

As illustrated in FIG. 2A, the display device DD may include a protection panel PP, a display panel DP, an input sensing layer ISL, a reflection prevention panel RPP, and a window WP. The input sensing layer ISL may be disposed or may be directly disposed on the display panel DP. In this specification, the words "Configuration B is directly disposed on configuration A" mean that there is no separate adhesive layer or member between the configuration A and the configuration B. The configuration B is formed through a continuous process on a base surface provided by the configuration A after the configuration A has been provided.

A combination of the display panel DP and the input sensing layer ISL may be disposed or may be directly disposed on the display panel DP may be defined as a display module DM. An optically clear adhesive member OCA may be disposed between the protection panel PP and the display module DM, between the display module DM and the reflection prevention panel RPP, and between the reflection prevention panel RPP and the window WP, respectively.

The display panel DP generates an image. The input sensing layer ISL obtains coordinate information of an external input (for example, a touch event). The protection panel PP may be disposed under or below the display module DM to protect the display module DM from an external impact. The display devices DD of FIGS. 2B to 2D explained hereinafter may also further include a protective panel PP, and unlike, the illustrated example, the protection panel PP may be replaced with a protection layer type.

The protective panel PP may include a synthetic resin film or a metal plate. The protective panel PP may have a multi-layer structure including a plurality of synthetic resin films and/or a plurality of metal plates.

The display panel DP according to an embodiment may be a light-emitting, display panel, and is not particularly limited thereto. For example, the display panel DP may be an organic light-emitting display panel or a quantum dot light-emitting, display panel. The light-emitting layer of the organic light-emitting display panel may contain an organic light-emitting material. The light-emitting layer of the quantum dot light-emitting display panel may contain quantum dots, quantum rods, and the like within the spirit and the scope of the disclosure, Hereinafter, the display panel DP is described as an organic light-emitting display panel.

The reflection prevention panel RPP reduces reflectivity of external light that is incident from the upper surface of the window panel WP. The reflection prevention panel RPP according to an embodiment may include a retarder and a polarizer. The retarder may be a film-type retarder or a liquid crystal coated retarder and include a λ/2 retarder and/or a λ/4 retarder. The polarizer may also be a film-type polarizer or a liquid crystal coated polarizer. The film type may include an elongation synthetic resin film, and the liquid crystal coated type may include liquid crystals arranged or disposed in a predetermined arrangement. The retarder and the polarizer may further include a protective film.

The reflection prevention panel RPP according to an embodiment may include color filters disposed on a base layer. The color filters may have a predetermined arrangement. The arrangement of the color filters may be determined taking into account the light-emitting colors of pixels included in the display panel DP. The reflection prevention panel RPP may further include a black matrix adjacent to the color filters.

The reflection prevention panel RPP according to an embodiment may include a destructive interference structure. For example, the destructive interference structure may include a first reflective layer and a second reflective layer which may be disposed on respective different layers. First reflective light and second reflective light, which may be respectively reflected by the first reflective layer and the second reflective layer, may destructively interfere with each other, thus reducing the reflectivity of external light.

Figure 2B:
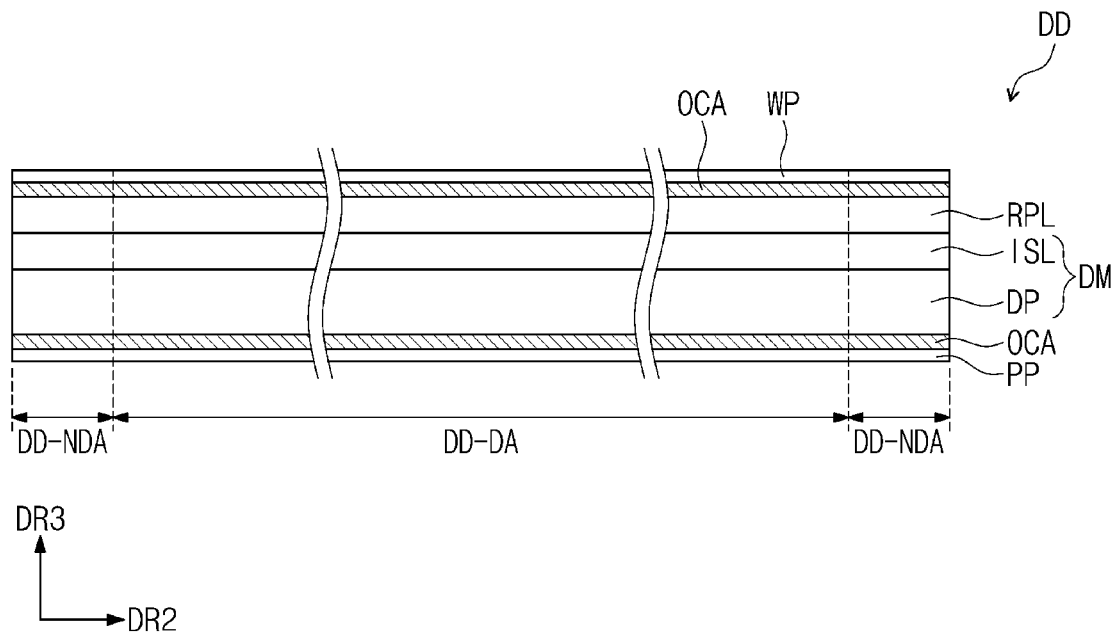
Figure 2C:
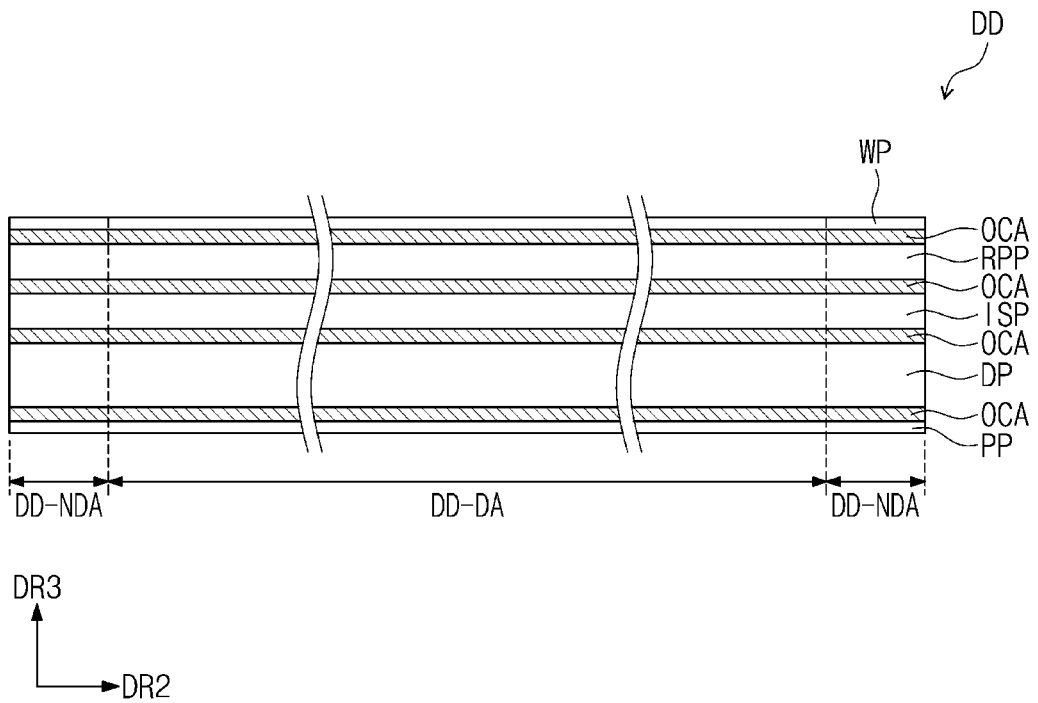
Figure 2D:
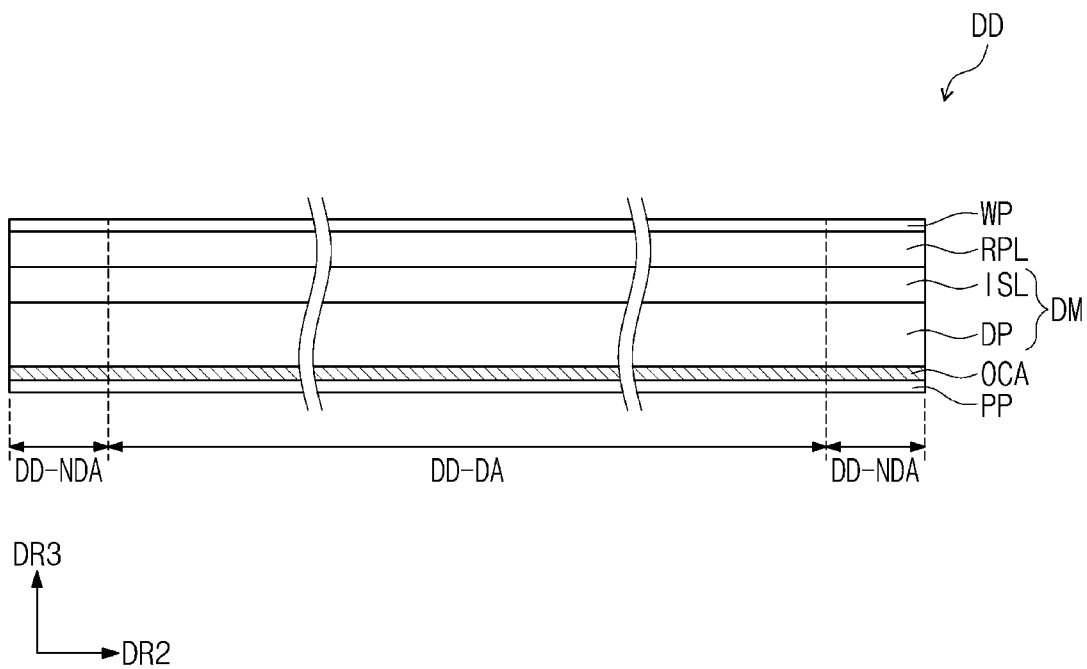

As illustrated in FIG. 2B, a reflection prevention layer RPL may be disposed on the input sensing layer ISL. The stacking order of the reflection prevention layer RPL and the input sensing layer ISL may vary. As illustrated in FIGS. 2C and 2D, the display device DD may include a display panel DR an input sensing panel ISP, a reflection prevention panel RPP, and a window WP. The stacking order of the input sensing panel ISP and the reflection prevention panel RPP may vary.

Figure 3A:
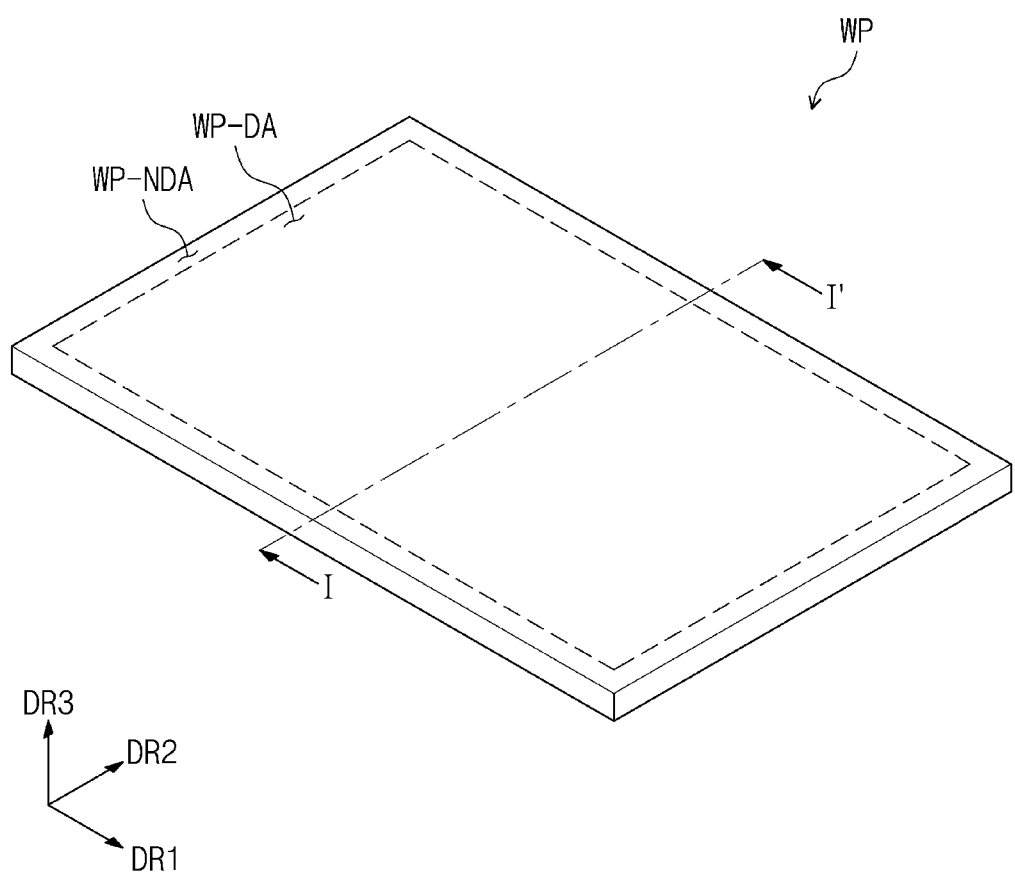
FIG. 3A is a plan view of a window according to an embodiment.

FIG. 3A is a plan view of a window WP according to an embodiment. FIGS. 3B to 3G are schematic cross-sectional views of a window WP according to an embodiment. FIG. 3H is a schematic cross-sectional view of a first portion BS-G according to an embodiment. FIG. 3I is a graph showing a stress change according to the thickness of the first portion BS-G.

FIGS. 3A to 3G illustrate a panel-type window WP. As illustrated in FIG. 3A, the window WP may include, in a plan view, a transmission region WP-DA and a light-blocking region WP-NDA corresponding to the image region DD-DA and the bezel region DD-NDA illustrated in FIG. 1A. The light-blocking area WP-NDA may be defined as a region in which a light blocking pattern WP-BZ described later may be disposed.

As illustrated in FIGS. 3B to 3G, the window WP according to an embodiment may include a base layer WP-BS and a light-blocking pattern WP-BZ. The base layer WP-BS may include two portions of different materials. The base layer WP-BS may include a first portion BS-G including an inorganic material and a second portion BS-P including an organic material. The first portion BS-G may occupy most of the area of the window WP in a plan view. The first portion BS-G may occupy about 90% or more of the planar area of the window WP. The second portion BS-P may be disposed on a border region of the window WP in a plan view. The second portion BS-P covers or overlaps at least a side surface SS of the first portion BS-G. The second portion BS-P may completely cover or overlap the side surface SS of the first portion BS-G. The second portion BS-P exposes the upper surface US of the first portion. BS-G. The base layer WP-BS having such a structure may improve the mechanical strength of the window WP. The breaking strength of the first portion BS-G may be about 0.8 Gpa or more. The breaking strength of the first portion BS-G may be in a range of about 0.8 Gpa to about 5 Gpa. The yield strain of the second portion BS-P may be about 1% or more. The yield strain of the second portion BS-P may be in a range of about 1% to about 5%. The yield strain of the second portion BS-P may be in a range of about 1.5% to about 3%.

The first portion BS-G may include glass. The first portion BS-G may be a glass substrate. The second portion BS-P may contain synthetic resin. The synthetic resin may contain at least one of epoxy acrylate resin, polyester acrylate resin, polyether acrylate resin, urethane acrylate resin, acrylic acrylate resin, unsaturated polyester resin, urethane resin, or acrylonitrile-butadiene-styrene (ABS) resin or a combination thereof. The second portion BS-P may contain synthetic rubber.

As illustrated in FIGS. 3B and 3E to 3G, the upper surface US of the first portion BS-G and the upper surface US-P of the second portion BS-P may provide or form a continuous surface. In other words, the upper surface US of the first portion BS-G and the upper surface US-P of the second portion BS-P may not form a step. For example, the upper surface US of the first portion BS-G and the upper surface US-P of the second portion BS-P may be coplanar. For example, some or a number of regions of the upper surface US of the first portion BS-G and the upper surface US-P of the second portion BS-P may form a curved surface having the same or similar curvature. On the other hand, as illustrated in FIGS. 3C and 3D, the upper surface US of the first portion BS-G and the upper surface US-P of the second portion BS-P may form a step.

Figure 3B:
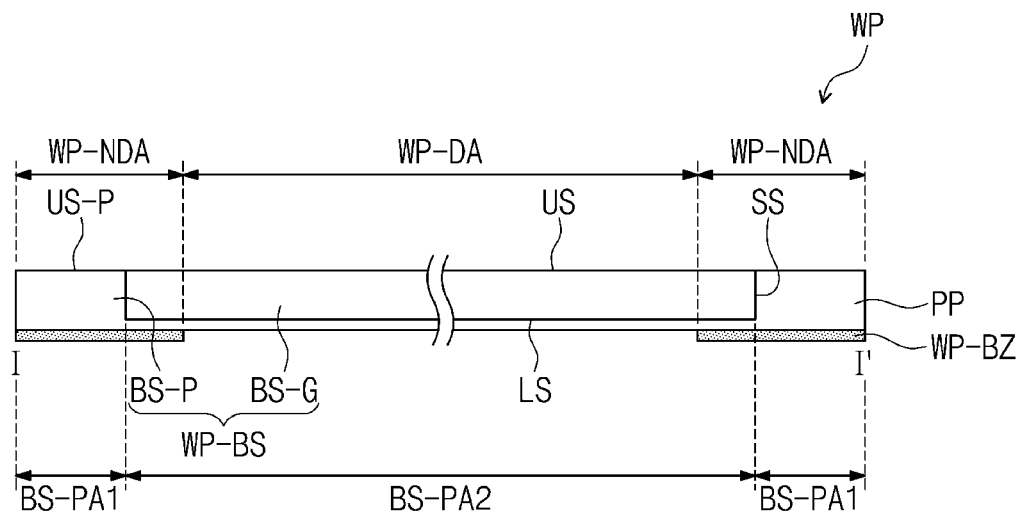
FIGS. 3B to 3G are schematic cross-sectional views of a window according to an embodiment.
Figure 3C:
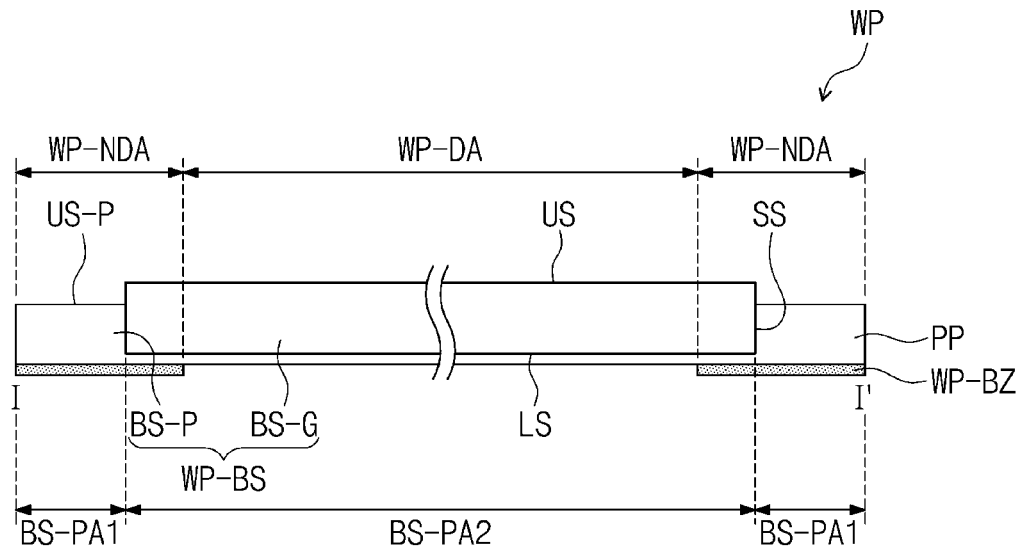
Figure 3D:
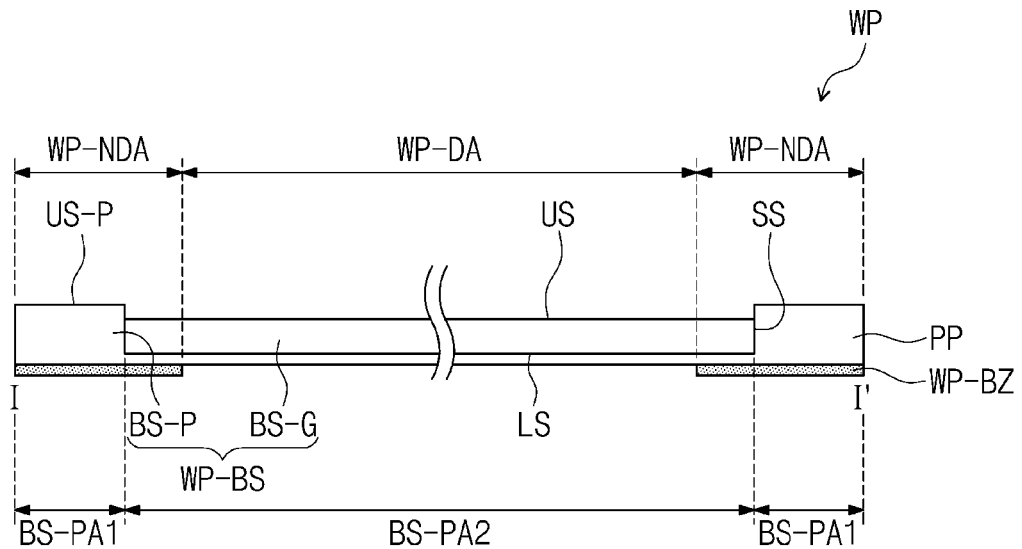
Figure 3E:
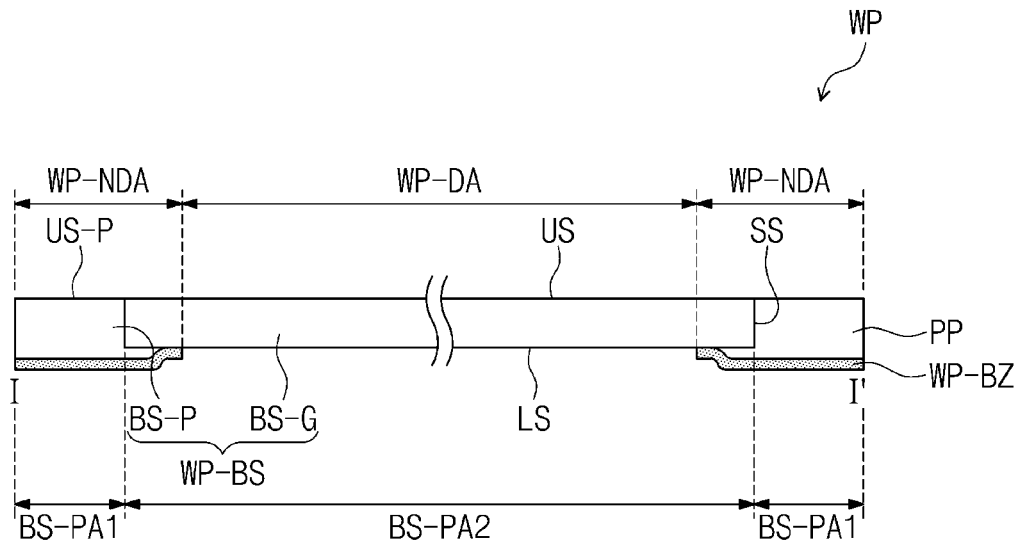
Figure 3F:
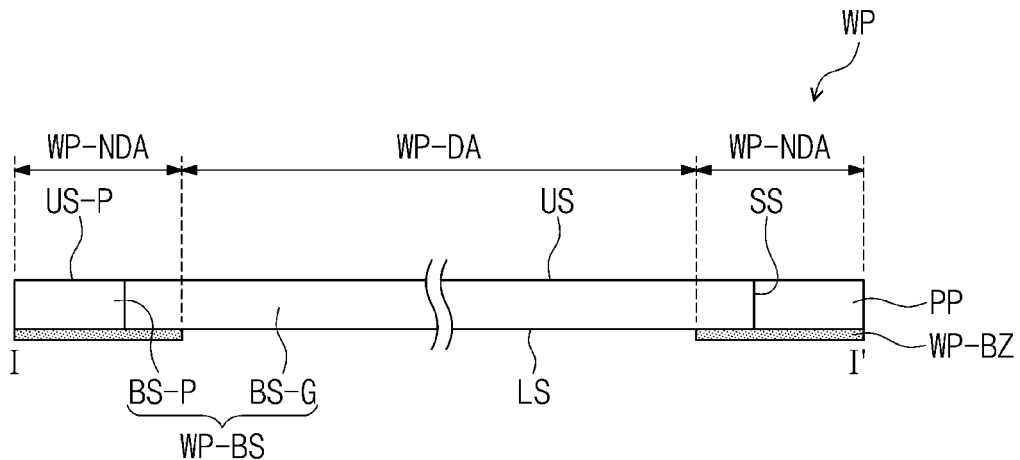
Figure 3G:
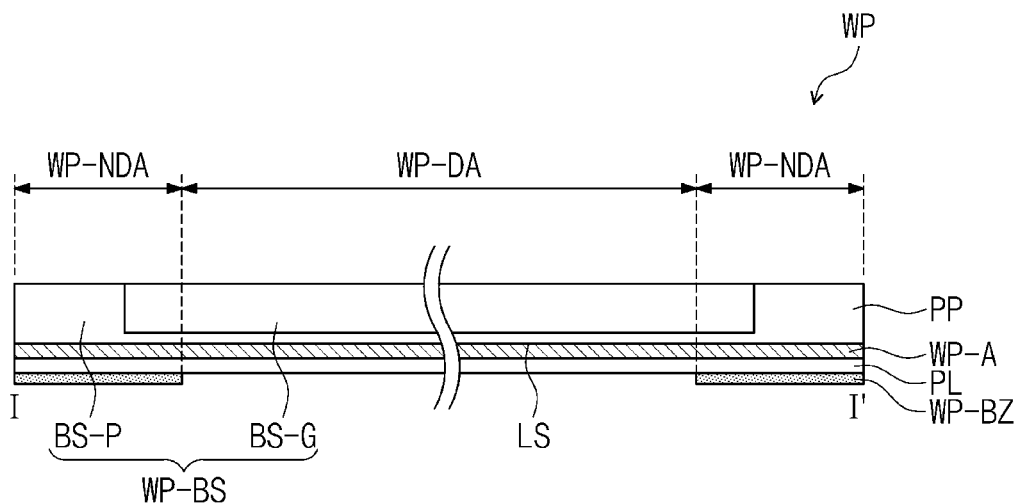
Figure 3H:
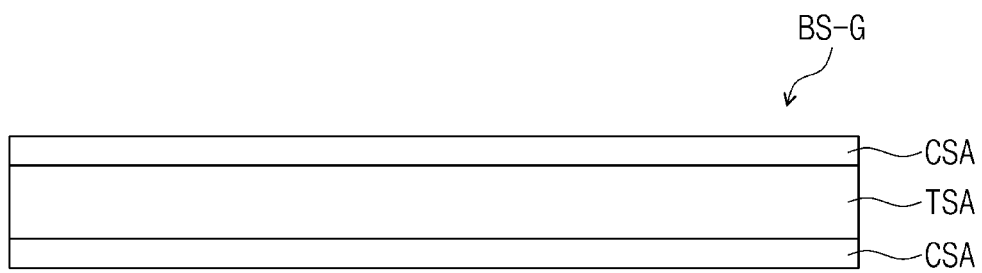
FIG. 3H is a schematic cross-sectional view of a first portion according to an embodiment.
Figure 3I:
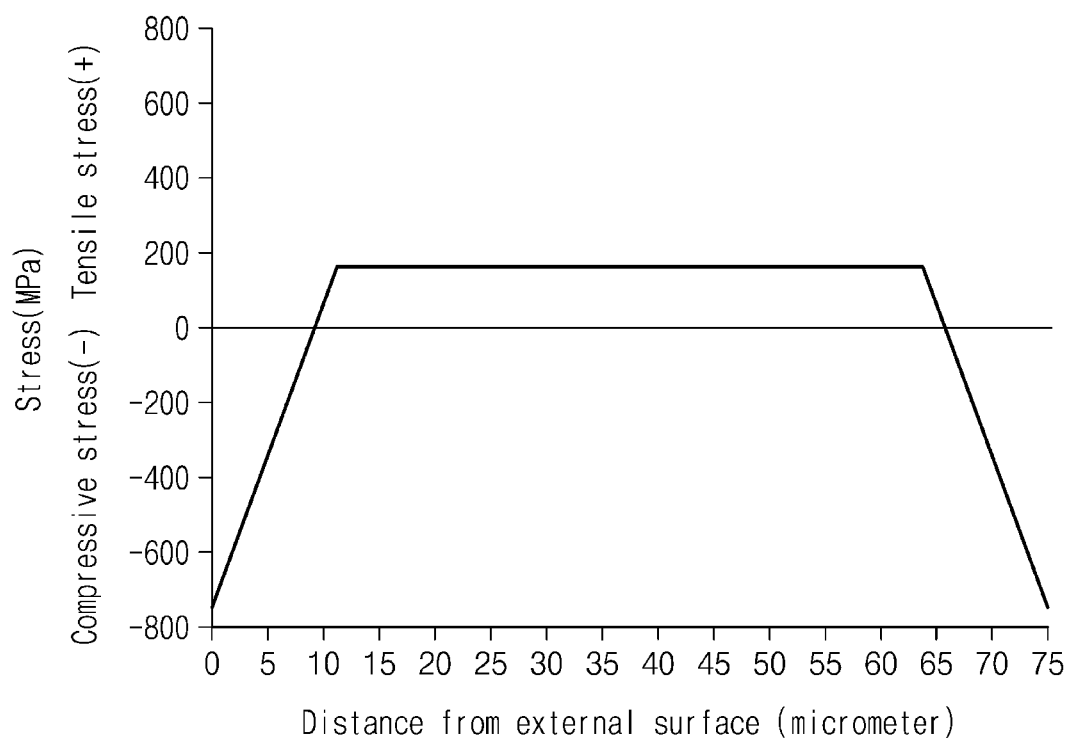
FIG. 3I is a graph showing a stress change according to the thickness of the first portion.

As illustrated in FIGS. 3B to 3F, the second portion BS-P covers or overlaps at least a side surface SS of the first portion BS-G. As illustrated in FIG. 3B, the second portion BS-P may completely cover or overlap the lower surface LS of the first portion BS-G. As illustrated in FIG. 3E, the second portion BS-P may partially cover or overlap the lower surface LS of the first portion BS-G. As illustrated in FIG. 3F, the second portion BS-P may completely expose the lower surface LS of the first portion BS-G.

As illustrated in FIGS. 3B and 3E, the second portion BS-P may include a first region BS-PA1 and a second region BS-PA2 having different thicknesses. The first region BS-PA1 has a first thickness, and the second region BS-PA2 has a second thickness smaller or less than the first thickness. The second region BS-PA2 may be a region overlapping the lower surface LS of the first portion BS-G. The first region BS-PA1 may be a region non-overlapping the lower surface LS of the first portion BS-G.

As illustrated in FIGS. 3B and 3F, the base layer WP-BS may have the same thickness regardless of the transmission region WP-DA and the light-blocking region WP-NDA. As illustrated in FIG. 3E, the transmission region WP-DA of the base layer WP-BS may have a smaller thickness than the light-blocking region WP-NDA.

As illustrated in FIGS. 3B to 3F, the light-blocking pattern WP-BZ may be disposed under or below the second portion BS-P. The light-blocking pattern WP-BZ may be disposed or may be directly disposed on the second portion BS-P. A portion of the light-blocking pattern WP-BZ may overlap the first portion BS-G, and the portion may be disposed or may be directly disposed on the first portion BS-G.

The light-blocking pattern WP-BZ may include a base resin and a dye or a pigment mixed therewith. For example, the light-blocking pattern WP-BZ may be formed by coating, printing, or vapor deposition. The light-blocking pattern WP-BZ may have a multi-layer structure. The light-blocking pattern WP-BZ may include a black color layer. The light-blocking pattern WP-BZ may include a colored color layer.

As illustrated in FIG. 3a the window WP may further include a synthetic resin film PL and a window adhesive layer WP-A attaching the synthetic resin film PL to the base layer WP-BS. The window adhesive layer WP-A may be an adhesive layer or a low strength adhesive layer. The light-blocking pattern WP-BZ may be disposed or may be directly disposed on the lower surface of the synthetic resin film PL. The manufacturing process of the window WP illustrated in FIG. 3G may include laminating the synthetic resin film PL to the lower surface LS of the base layer WP-BS after forming a light-blocking pattern WP-BZ on the synthetic resin film PL. The structure of the base layer WP-BS may be changed or may be varied as illustrated in FIG. 3E or 3F.

The first portion BS-G illustrated in FIGS. 3B to 3G may be a chemically strengthened glass substrate. As illustrated in FIG. 3H, the first portion BS-G may include a compressive stress region CSA and a tensile stress region TSA on a cross section. Compressive stress regions CSA may be disposed on both sides of the tensile stress region TSA. One of the compressive stress regions CSA provides an upper surface US and the other provides a lower surface LS. FIG. 3I illustrates a stress profile along the thickness direction from the upper surface US to the lower surface LS. FIG. 3I a graph showing a stress change according to the thickness of the first portion.

The compressive stress region CSA may be disposed only in the region providing an upper surface US. In a chemical strengthening process, the region providing; a lower surface LS may be covered with or overlapped by a protective film to prevent ion exchange.

The chemically strengthened glass substrate is suitable for a foldable display device because it has great mechanical strength even with a small or thin thickness. The thickness of the glass portion BS-G may be about 100 µm or less. The thickness of the glass portion BS-G may be in a range of about 20 µm to about 100 µm.

Although not separately illustrated, the window WP may further include a functional coating layer disposed on the upper surface of the base layer WP-BS. The functional coating layer may include an anti-fingerprint layer, a reflection prevention layer, and a hard coating layer.

Although the window WP including the light-blocking pattern WP-BZ has been described as an example, in an embodiment, the light-blocking pattern WP-BZ may be omitted in the window WP, and the light-blocking pattern WP-BZ may be disposed on an input sensor or in an anti-reflection unit.

The manufacturing process of the window WP illustrated in FIGS. 3B to 3G will be described. A chemically strengthened glass substrate is prepared. A tempered glass substrate may be manufactured by performing a chemical strengthening process on a raw glass substrate. The raw glass substrate may have a polished edge.

A synthetic resin layer is formed or disposed on a chemically strengthened glass substrate. The synthetic resin layer may be formed by a slit coating, bar coating, spin coating, or glass direct molding (GDM) method but is not limited thereto. The synthetic resin layer may not be formed or disposed on one or a surface of the glass substrate contacting the stage of the manufacturing facility, and the synthetic resin layer may be formed or disposed on a side surface of the glass substrate and on the other or another surface facing the one surface or a surface of the glass substrate in the thickness direction. The coating process may be performed in a state in which a protective film may be attached to one or a surface of the glass substrate. The synthetic resin layer formed or disposed on the other or another surface of the glass substrate may be partially removed through a subsequent process. The region in which the synthetic resin layer is formed or disposed may be controlled by partially attaching a protective film to the other surface of the glass substrate.

In this way, the base layer WP-BS illustrated in FIGS. 3B to 3G may be formed. Thereafter, a process of forming the light blocking pattern WP-BZ or a lamination process of the synthetic resin film PL may be performed.

Figure 4A:
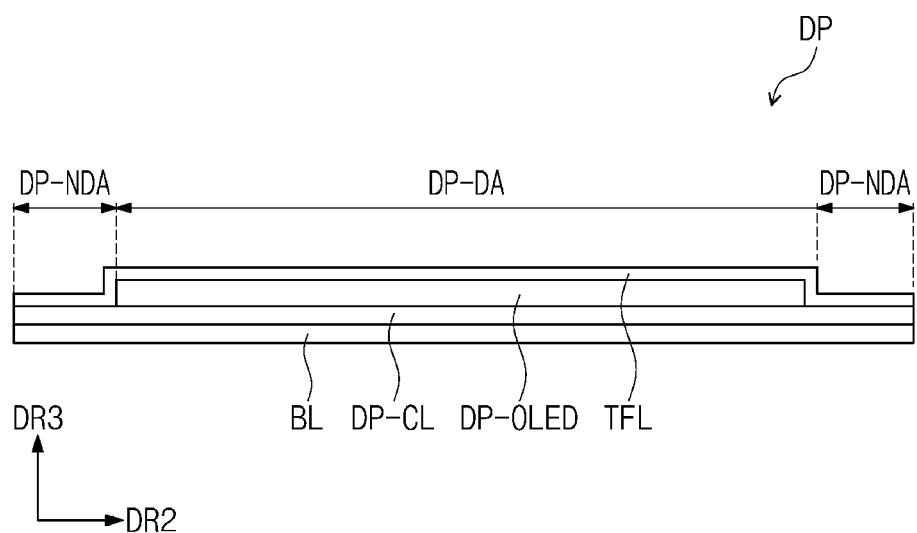
FIGS. 4A and 4B are schematic cross-sectional views of a display panel according to an embodiment.
Figure 4B:
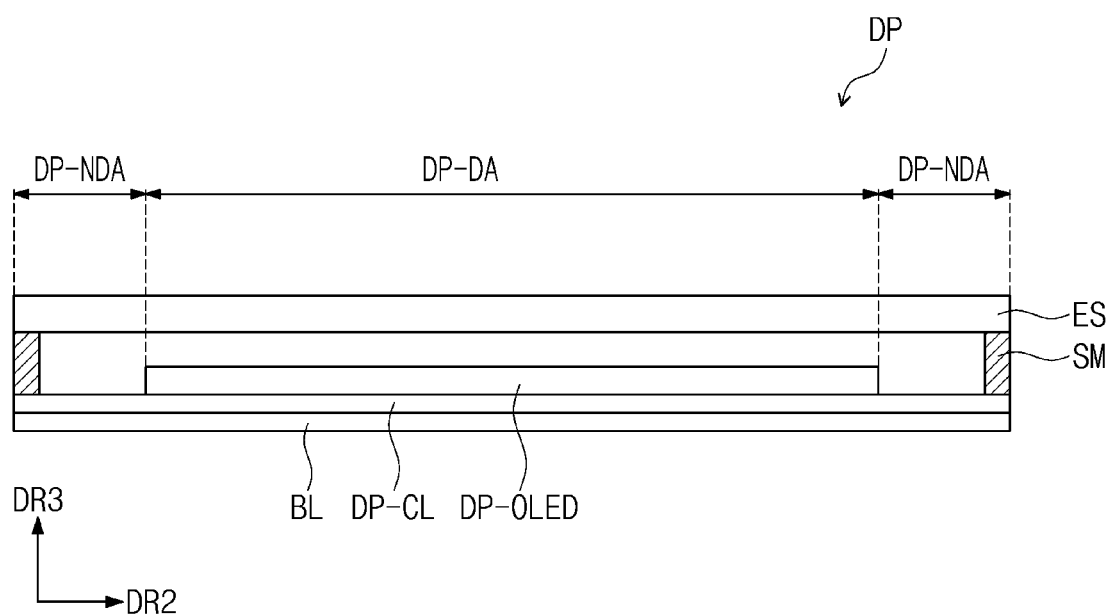

FIGS. 4A and 4B are schematic cross-sectional views of a display panel according to an embodiment.

As illustrated in FIG. 4A, the display panel DP may include a base layer BL, a circuit element layer DP-CL disposed on the base layer BL, a display element layer DP-OLED, and an upper insulating layer. TFL. The display region DP-DA and the non-display region DP-NDA corresponding to the image region DD-DA and the bezel region DD-NDA illustrated in FIG. 1A may be defined in the display panel DP. In an embodiment, that the regions correspond to each other means that they overlap each other, and the regions are not limited to having the same area.

The base layer BL may include at least one synthetic resin film. The base layer BL may include a plastic substrate, a glass substrate, a metal substrate, an organic or an inorganic composite material substrate, or the like within the spirit and the scope of the disclosure.

The circuit element layer DP-CL may include at least one of an intermediate insulating layer or a circuit element. The intermediate insulating layer may include at least one intermediate inorganic filial and at least one intermediate organic film. The circuit element may include signal lines, a pixel driving circuit, and the like within the spirit and the scope of the disclosure.

The display element layer DP-OLED may include at least organic light-emitting diodes. The display element layer DP-OLED may further include an organic film such as a pixel defining film.

The upper insulating layer TFL may include a plurality of thin films. Some or a number of thin films may be disposed to improve optical efficiency, and some other or a number of other thin films may be disposed to protect organic light-emitting diodes. The plurality of thin films may include a thin-film encapsulation layer. The thin-film encapsulation layer may have a stacked structure of an inorganic film or an organic film or an inorganic film. The plurality of thin films may include a refractive index matching layer.

As illustrated in FIG. 4B, the display panel DP may include a base layer BL, a circuit element layer DP-CL disposed on the base layer BL, a display element layer DP-OLED, an encapsulation substrate ES, and a sealant SM that combines the base layer BL with the encapsulation substrate ES. The base layer BL, the circuit element layer DP CL, and the display element layer DP-OLED may collectively be referred to as a display substrate DS. The encapsulation substrate ES may be spaced apart from the display element layer DP-OLED with a predetermined gap therebetween. The base layer BL and the encapsulation substrate ES may include a plastic substrate, a glass substrate, a metal substrate, an organic or an inorganic composite material substrate, or the like within the spirit and the scope of the disclosure. The sealant SM may include an organic adhesive member, a frit, or the like within the spirit and the scope of the disclosure.

Figure 5A:
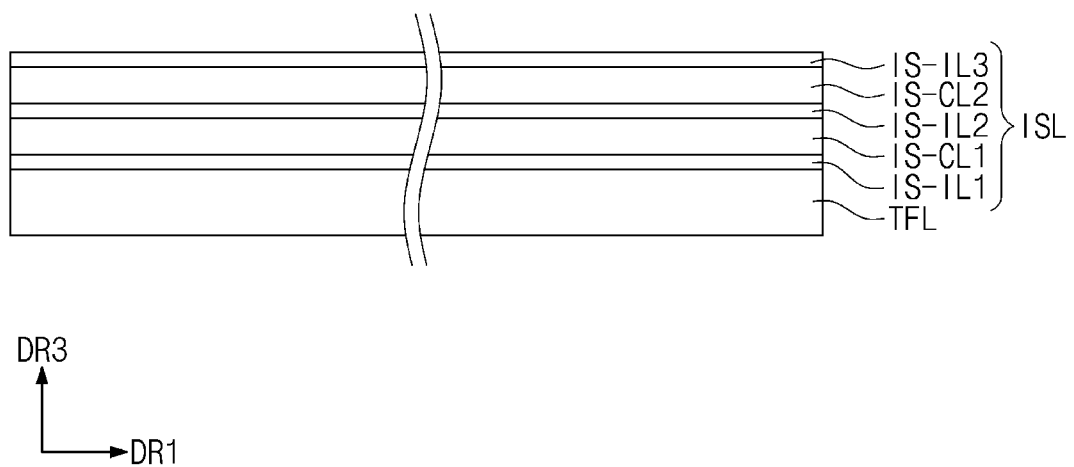
FIG. 5A is a schematic cross-sectional view of an input sensor according to an embodiment.
Figure 5B:
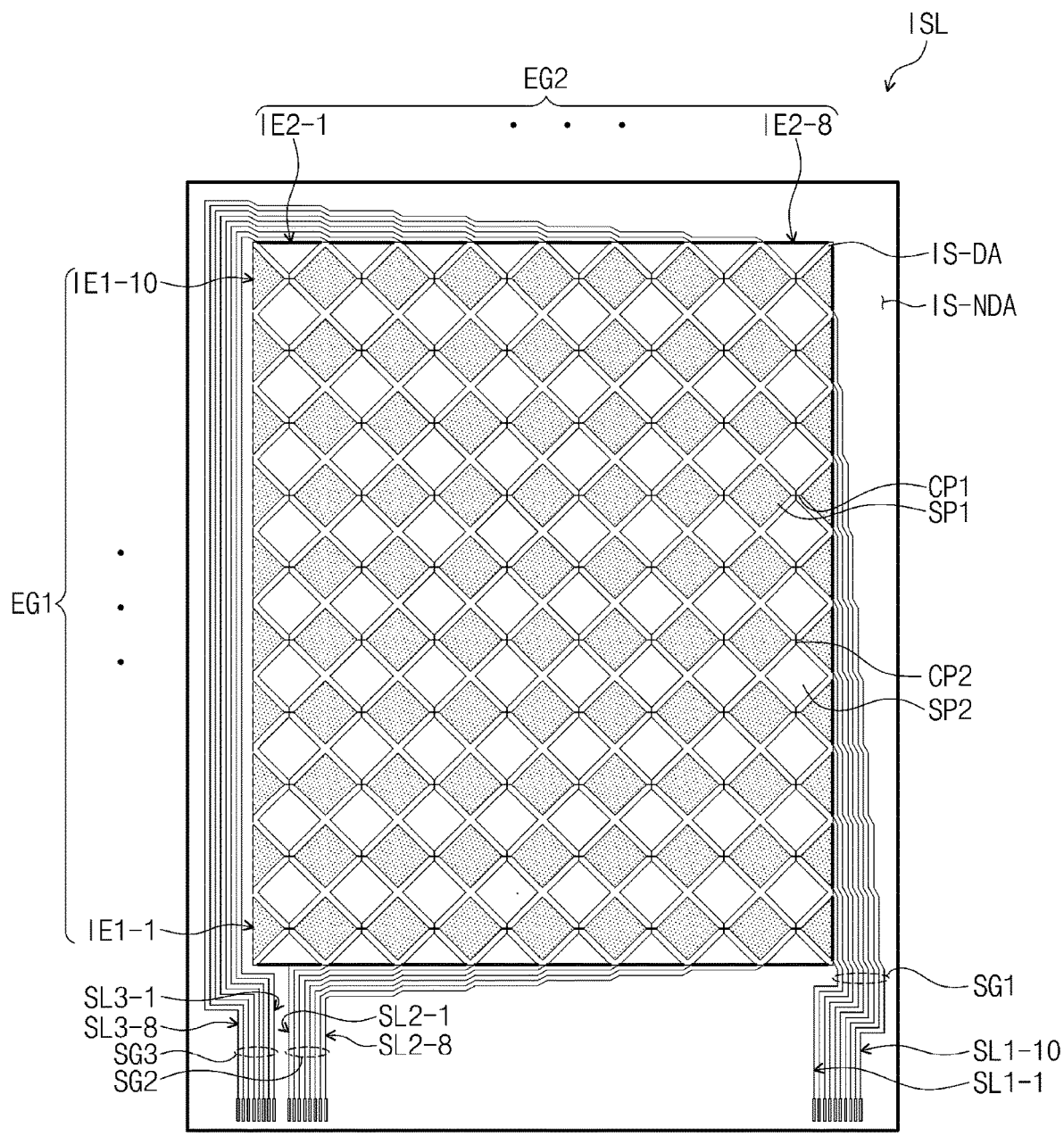
FIG. 5B is a plan view of an input sensor according to an embodiment.

FIG. 5A is a schematic cross-sectional view of an input sensor ISL according to an embodiment. FIG. 5B is a plan view of an input sensor ISL according to an embodiment. In this embodiment, the "layer" type input sensor ISL is illustrated as an example.

As illustrated in FIG. 5A, the input sensor ISL may include a first insulating layer IS-IL1, a first conductive layer IS-CL1, a second insulating layer IS-IL2, a second conductive layer IS-CL2, and a third insulating layer IS-IL3. The first insulating layer IS-IL1 may be disposed or may be directly disposed on the upper insulating layer TFL. In an embodiment, the first insulating layer IS-IL1 may be omitted. The "panel" type input sensor LSL may further include a base film supporting the first insulating layer IS-IL1.

Each of the first conductive layer IS-CL1 and the second conductive layer IS-CL2 may have a single-layer structure or a multilayer structure stacked along the third direction axis DR3. A multi-layered conductive layer may include at least two of transparent conductive layers or metal layers. The multi-layered conductive layer may include metal layers containing different metals. The transparent conductive layer may contain indium tin oxide (ITO), indium zinc oxide (IZO), zinc oxide (ZnO), indium tin zinc oxide (ITZO), poly(3,4-ethylenedioxythiophene) (PEDOT), metal nanowire, and graphene. The metal layer may contain molybdenum, silver, titanium, copper, aluminum, and alloys thereof. For example, each of the first conductive layer IS-CL1 and the second conductive layer IS-CL2 may have a three-layered metal layer structure, for example, a three-layered structure of titanium/aluminum/titanium.

Each of the first conductive layer IS-CL1 and the second conductive layer IS-CL2 may include a plurality of conductive patterns. Hereinafter, it is described that the first conductive layer IS-CL1 may include first conductive patterns, and the second conductive layer IS-CL2 may include second conductive patterns. Each of the first conductive patterns and the second conductive patterns may include sensing electrodes and signal lines electrically connected thereto.

Each of the first insulating layer IS-IL1 to the third insulating layer IS-IL3 may include an inorganic material or an organic material. In an embodiment, the first insulating layer IS-IL1 and the second insulating layer IS-IL2 may be inorganic films containing inorganic materials. The inorganic film may contain at least one of aluminum oxide, titanium oxide, silicon oxide, silicon oxynitride, zirconium oxide, or hafnium oxide or a combination thereof. The third insulating layer may include an organic layer. The organic film may contain at least one of acrylic resin, methacrylic-based resin, polyisoprene, vinyl-based resin, epoxy-based resin, urethane-based resin, cellulose-based resin, siloxane-based resin, polyimide-based resin, polyamide-based resin, or perylene-based resin or a combination thereof.

As illustrated in FIG. 5B, the input sensor ISL may include a sensing region IS-DA and a wiring region IS-NDA corresponding to the display region DP-DA (see FIG. 4A) and the non-display region DP-NDA (see FIG. 4A) of the display panel DP (see FIG. 4A). The sensing region IS-DA may be defined as a region in which a first electrode group EG1 and a second electrode group EG2, which will be described later, are disposed.

The input sensor ISL may include the first electrode group EG1, the second electrode group EG2, a first signal line group SG1 electrically connected to the first electrode group EG1, and a second signal line group SG2 electrically connected to the second electrode group EG2.

The first electrode group EG1 including ten first electrodes IE1-1 to IE1-10 is illustrated as an example. The second electrode group EG2 including eight second electrodes IE2-1 to IE2-8 is illustrated as an example. The first signal line group SG1 including ten first signal lines SL1-1 to SL1-10 is illustrated as an example. The second signal line group SG2 including; eight second signal lines SL2-1 to SL2-8 is illustrated as an example. In an embodiment, the input sensor ISL may further include a third signal line group SG3 including eight third signal lines SL3-1 to SL3-8.

An electrode of the first electrode group EG1 may include a plurality of first sensor parts SP1 and a plurality of first connection parts CP1. The first sensor parts SP1 may be arranged or disposed along the second direction DR2. Each of the first connection parts CP1 electrically connects two adjacent first sensor parts SP1 among the first sensor parts SP1.

An electrode of the second electrode group EG2 may include a plurality of second sensor parts SP2 and a plurality of second connection parts CP2. The second sensor parts SP2 may be arranged or disposed along the first direction DR1. Each of the second connection parts CP2 electrically connects two adjacent second sensor parts SP2 among the second sensor parts SP2.

The electrode of the first electrode group EG1 and the electrode of the second electrode group EG2 are insulated from each other. FIG. 5B illustrates an embodiment in which a crossing or intersecting takes place at the first connection part CP1 and the second connection part CP2. Some or a number of the plurality of first sensor parts SP1, the plurality of first connection parts CP1, the plurality of second sensor parts SP2, and the plurality of second connection parts CP2 may be formed by patterning the first conductive layer IS-CL1 illustrated in FIG. 5A. Others may be formed by patterning the second conductive layer IS-CL2 illustrated in FIG. 5A. The plurality of first sensor parts SP1 and the plurality of second sensor parts SP2 may have a substantially mesh shape.

In an embodiment, the plurality of first connection parts CP1 may be formed from the first conductive layer IS-CL1, and the plurality of first sensor parts SP1, the plurality of second sensor parts SP2, and the plurality of second connection parts CP2 may be formed from the second conductive layer IS-CL2. The first sensor parts SP1 and the first connection part CP1 may be electrically connected through contact holes penetrating the second insulating layer IS-IL2.

In an embodiment, the plurality of first connection parts CP1 and the plurality of second connection parts CP2 are illustrated as crossing or intersecting each other, but the disclosure is not limited thereto. For example, each of the second connection parts CP2 may be changed in the form of "<" and/or ">" so as not to overlap the first connection parts CP1. The second connection parts CP2 in the form of "<" or ">" may overlap the first sensor parts SP1.

In an embodiment, the input sensor ISL may be a capacitive touch panel that senses an external input by a mutual cap method. One of the first electrode group EG1 and the second electrode group EG2 receives a detection signal, and the other one outputs, as an output signal, the amount of change in capacitance between the first electrode group EG1 and the second electrode group EG2.

Figure 6A:
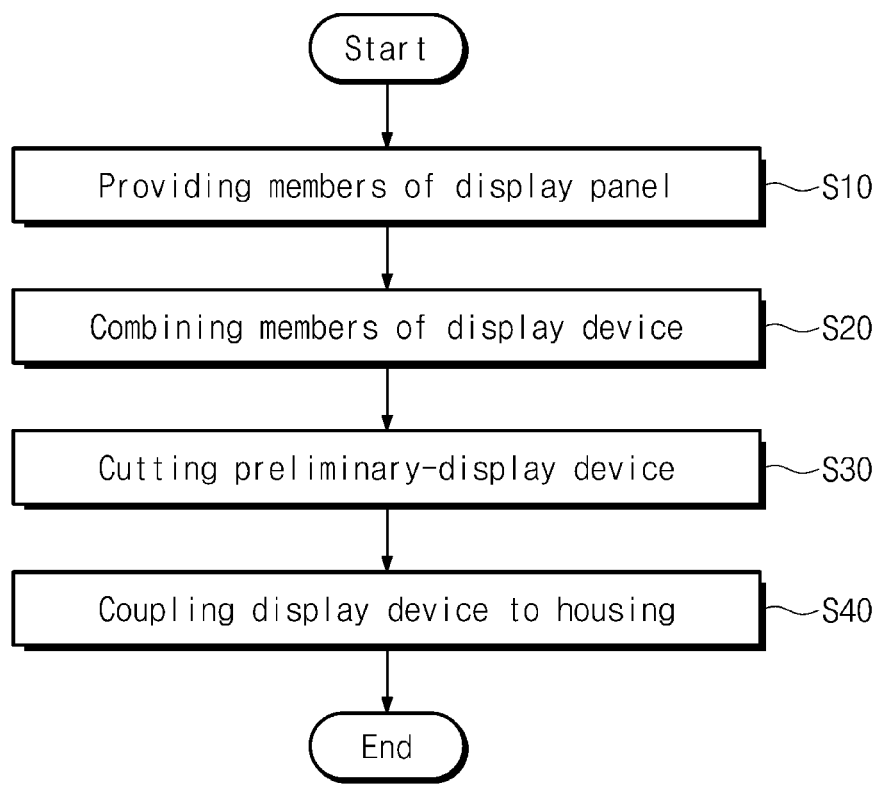
FIG. 6A is a flowchart showing a method of manufacturing a display device according to an embodiment.
Figure 6B:
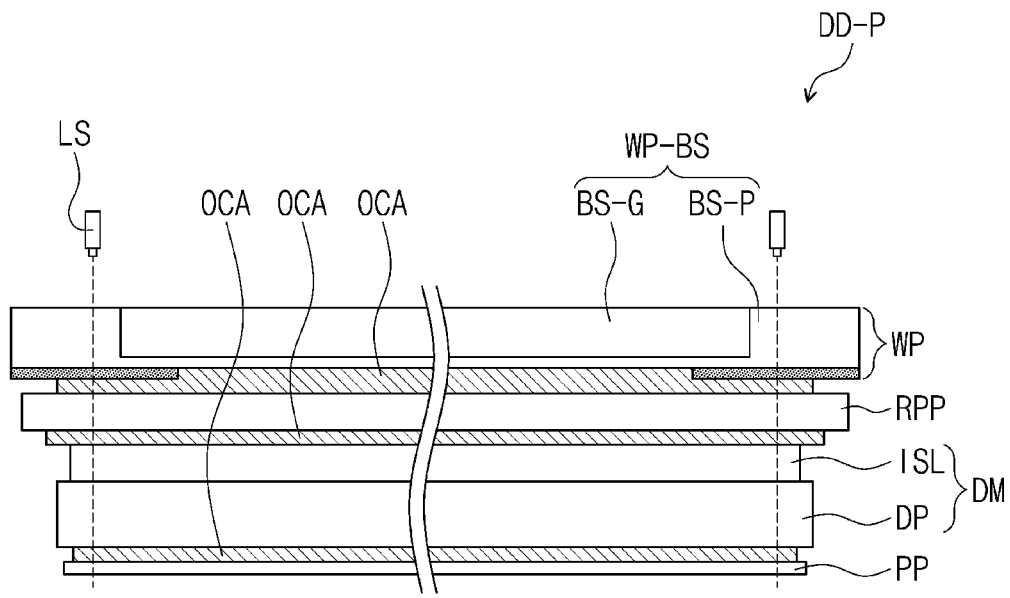
FIG. 6B is a schematic cross-sectional view illustrating a method of manufacturing a display device according to an embodiment.
Figure 6C:
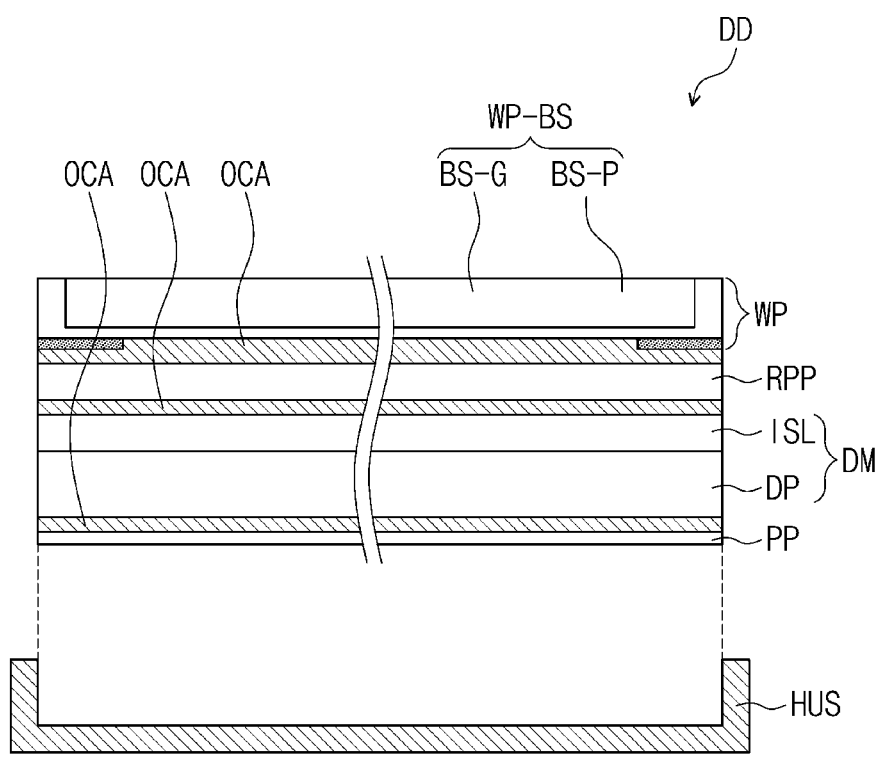
FIG. 6C is a schematic cross-sectional view illustrating a method of manufacturing a display device according to an embodiment.

FIG. 6A is a flowchart showing a method of manufacturing a display device DD according to an embodiment. FIG. 6B is a schematic cross-sectional view illustrating a method of manufacturing a display device DD according to an embodiment. FIG. 6C is a schematic cross-sectional view illustrating a method of manufacturing a display device DD according to an embodiment. Detailed descriptions of the same components as those described with reference to FIGS. 1A to 5B will be omitted.

As shown in FIG. 6A, members of the display device are provided or disposed (S10). The members of the display device may include at least an adhesive member OCA, a display panel DP, and a window WP described with reference to FIGS. 3A to 3I. The members of the display device may further include an input sensing unit, and the input sensing layer ISL described with reference to FIGS. 5A and 5B may be provided in the form of a display module DM (a form integrated with the display panel DP) as described with reference to FIG. 2A. The members of the display device may further include a protection panel PP and a reflection prevention panel RPP. Among the members described above, members other than the adhesive member OCA and the window WP may be collectively referred to as functional members.

The members of the display device provided at the manufacturing stage of the display device may have a larger area in a plan view than the components of the display device described with reference to FIGS. 1A to 5B. This is because the border regions a the members of the provided display device are cut away, as described later.

The members of the display device are combined (S20). After an adhesive member OCA between the window WP and a functional member is disposed, the window WP and the functional member are combined. In a case that the functional member may include a plurality of members, an adhesive member OCA may also be disposed among the plurality of members.

As illustrated in FIG. 6B, an adhesive member OCA may be disposed between the window WP and the reflection prevention panel RPP, between the reflection prevention panel RPP and the display module DM, and between the display module DM and the protective panel PP. An upper member and a lower member may be combined with an adhesive member OCA therebetween (lamination process). The display device DD illustrated in FIG. 6B may be formed through three lamination processes. Unlike the continuous lamination process described above, the display device DD illustrated in FIG. 6B may be formed through a roll-to-roll lamination process in an embodiment. A plurality of members and a plurality a adhesive members may be laminated at the same time.

A step may be formed on the or a side surface of the preliminary-display device DD-P illustrated in FIG. 6B. This is because the combined functional member and adhesive members OCA have a different area from the window WP. Another reason Why the step is formed on the side surface is that a process error occurs in a lamination process.

As illustrated in FIGS. 6A and 6B, a border region of the preliminary-display device DD-P is cut away (S30). The step formed on the or a side surface of the preliminary-display device DD-P is removed. A cutting line is set inside the second portion BS-P in a plan view, and a window WP, an adhesive member OCA, and a functional member are cut along the cut line. The cutting line may be a virtual line that is set in the preliminary-display device DD-P by mechanical equipment including a computer system.

The cutting may be performed by using a laser source or a laser LS. The laser source LS may include a CO2 laser, an excimer laser, a fiber laser, and the like within the spirit and the scope of the disclosure. When the window WP, the adhesive member OCA, and the functional members are cut by irradiation with a laser beam, the cut surfaces thereof may be aligned in one or a plane. The cut surfaces of them may form a side surface of the display device DD.

As illustrated in FIG. 6C, at least a cut surface of the second portion BS-P and a cut surface of the adhesive member OCA may be aligned. A cut surface of the panel DP may include cut surfaces of insulating layers constituting the display panel DP illustrated in FIG. 4A. A cut surface of the input sensor ISL may include cut surfaces of the insulating layers IS-IL1, IS-IL2, and IS-IL3 of the input sensor ISL with reference to FIG. 5A.

The first portion BS-G having high breaking strength is not easy to cut when compared to the second portion BS-P. In a case that the first portion BS-G is cut, the breaking strength of the region around the cut surface is rapidly reduced. For example, in the case of a chemically strengthened glass substrate, when the stress thereof is unbalanced, the breaking strength of the region around the cut surface may be lowered to about 50% or less. As a result, a defect occurs that lowers the mechanical strength of the window WP. In an embodiment, since the second portion BS-P is cut, the breaking strength of the window WP may be maintained.

As illustrated in FIGS. 6A and 6C, the display device DD may be coupled or connected to a housing HUS (S40). According to an embodiment, assembly error of the housing HUS of the display device DD may be reduced. The preliminary-display device DD-P illustrated in FIG. 6B has a manufacturing error and a lamination process error of each of the members of the display device, whereas the display device DD illustrated in FIG. 6C has only a cutting process error since the display device DD is cut according to a design value considering a combination with the housing HUS. It is possible to minimize errors in a cutting process by repeating the cutting process.

Although the disclosure has been described with reference to embodiments thereof, those skilled in the art or those of ordinary skill in the art will understand that various modifications and changes can be made to the disclosure within the scope of the disclosure that do not depart from the spirit and scope of the disclosure as described in the claims.

Accordingly, the scope of the disclosure should not be limited to the content described in the detailed description of the specification, but should be determined by the claims as hereinafter described.

The invention claimed is:

1. A display device comprising:
   a window including:
      a glass portion; and
      a synthetic resin portion overlapping at least a side surface of the glass portion and exposing an upper surface of the glass portion;
   a display panel disposed below the window; and
   an adhesive layer disposed between the window and the display panel,
   wherein a side surface of the display panel and a side surface of the adhesive layer are aligned with a side surface of the synthetic resin portion.

2. The display device of claim 1, wherein the synthetic resin portion overlaps at least a portion of a lower surface of the glass portion.

3. The display device of claim 1, wherein the synthetic resin portion completely overlaps a lower surface of the glass portion.

4. The display device of claim 1, wherein
   the synthetic resin portion comprises:
      a first region having a first thickness; and
      a second region having a second thickness less than the first thickness of the first region,
   the first region does not overlap a lower surface of the glass portion in a plan view, and
   the second region overlaps the lower surface of the glass portion in a plan view.

5. The display device of claim 1, wherein the upper surface of the glass portion and an upper surface of the synthetic resin portion are continuous or form a step.

6. The display device of claim 1, wherein
   the window comprises a light-blocking pattern disposed below the synthetic resin portion; and
   the light-blocking pattern overlaps at least the synthetic resin portion in a plan view.

7. The display device of claim 6, wherein
   the window further comprises:
      a synthetic resin film disposed below the glass portion and the synthetic resin portion; and
      a window adhesive layer that attaches the synthetic resin film to the glass portion and the synthetic resin portion, and
   the light-blocking pattern is directly disposed on a lower surface of the synthetic resin film.

8. The display device of claim 1, wherein a thickness of the glass portion is about 100 µm or less.

9. The display device of claim 1, wherein the glass portion comprises:
   a tensile stress region; and
   a compressive stress region disposed outside of the tensile stress region, the compressive stress region forming the upper surface of the glass portion.

10. The display device of claim 1, wherein the display device is foldable.

11. The display device of claim 1, further comprising:
   an input sensor disposed below the window; and
   a polarizer disposed below the window.

12. The display device of claim 1, wherein the synthetic resin portion completely overlaps the side surface of the glass portion.

13. A display device comprising:
   a window including:
      a first portion including an inorganic material; and
      a second portion overlapping at least a side surface of the first portion and exposing an upper surface of the first portion, the second portion including an organic material;
   a display panel disposed below the window; and
   an adhesive layer disposed between the window and the display panel,
   wherein a side surface of the display panel and a side surface of the adhesive layer are aligned with a side surface of the synthetic resin portion.

14. The display device of claim 13, wherein
   a breaking strength of the first portion of the window is in a range of about 0.8 Gpa to about 5 Gpa, and
   a yield strain of the second portion of the window is in a range of about 1% to about 5%.

15. The display device of claim 13, wherein
   the first portion includes a chemically strengthened glass, and
   the second portion includes a synthetic resin.

16. A method for manufacturing a display device, the method comprising:
   providing an adhesive member, a functional member, and a window, wherein the window includes a glass portion, and a synthetic resin portion overlapping at least a side surface of the glass portion and exposing an upper surface of the glass portion;
   disposing the adhesive member between a lower surface of the synthetic resin portion and the functional member and combining the window with the functional member;
   setting a cutting line inside of the synthetic resin portion; and
   cutting the window, the adhesive member, and the functional member along the cutting line of the synthetic resin portion.

17. The method of claim 16, wherein the functional member comprises at least one of a display panel, a polarizer, and an input sensor.

18. The method of claim 16, wherein the cutting of the window includes cutting by a laser.

19. The method of claim 16, wherein a side surface of the synthetic resin portion is aligned with a side surface of the adhesive member.

\* \* \* \* \*

UNITED STATES PATENT AND TRADEMARK OFFICE
CERTIFICATE OF CORRECTION

PATENT NO. : 12,156,420 B2
APPLICATION NO. : 17/282920
DATED : November 26, 2024
INVENTOR(S) : Seongjin Hwang et al.

Page 1 of 1

It is certified that error appears in the above-identified patent and that said Letters Patent is hereby corrected as shown below:

On the Title Page

Item (22) PCT Filed:
Replace "Oct. 12, 2019" with --Oct. 17, 2019--.

Signed and Sealed this
Fifteenth Day of April, 2025

Coke Morgan Stewart
*Acting Director of the United States Patent and Trademark Office*